United States Patent [19]
Asada et al.

[11] Patent Number: 5,944,540
[45] Date of Patent: Aug. 31, 1999

[54] OPERATION ASSURING STRUCTURE OF ELECTRONIC CIRCUIT BOARD IN CONNECTOR FOR SAID CIRCUIT BOARD

[75] Inventors: Junichi Asada; Hideo Taguchi, both of Kawasaki; Isao Baba, Chigasaki; Toshiyasu Ito, Togane, all of Japan

[73] Assignees: Kabushiki Kaisha Toshiba, Kanagawa; Yamaichi Electronics Co., Ltd., Tokyo, both of Japan

[21] Appl. No.: 09/095,754

[22] Filed: Jun. 11, 1998

[51] Int. Cl.$^6$ ............................................. H01R 4/66
[52] U.S. Cl. ................................. 439/101; 439/608
[58] Field of Search ............................ 439/951, 108, 439/59, 608, 101

[56] References Cited

U.S. PATENT DOCUMENTS

| | | | |
|---|---|---|---|
| 4,303,291 | 12/1981 | Dines | 439/951 |
| 5,026,292 | 6/1991 | Pickels et al. | 439/108 |
| 5,035,632 | 7/1991 | Rudoy et al. | 439/108 |
| 5,542,851 | 8/1996 | Chikano | 439/608 |

*Primary Examiner*—Gary Paumen
*Assistant Examiner*—Briggitte R. Hammond
*Attorney, Agent, or Firm*—Wenderoth, Lind & Ponack, L.L.P.

[57] ABSTRACT

An operation assuring structure of an electronic circuit board in a connector for the electronic circuit board including an insert plate portion disposed on an end portion of an electronic circuit board and adapted to be inserted into a receiving port of a connector, a plurality of signal electronic pads arranged on a surface of the insert plate portion, and a plurality of signal contacts disposed within the receiving port of the connector and adapted to be contacted to the signal electrode pads, wherein a cut-off grounding contact, which is not conductive to the electronic circuit board, is interposed between the signal contacts within the receiving port, and the cut-off grounding contact has a length dimension enough to extend in parallel to the signal contacts and to interpose a distal end thereof between the signal electrode pads on the insert plate portion.

3 Claims, 4 Drawing Sheets

OPERATION ASSURING STRUCTURE OF ELECTRONIC CIRCUIT BOARD IN CONNECTOR FOR SAID CIRCUIT BOARD

BACKGROUND OF THE INVENTION

This invention relates to a connector used for connecting an extension electronic circuit board having a memory device to a motherboard in a computer or similar other purposes, and more particularly to an operation assuring structure of an electronic circuit board in a connector for said electronic circuit board.

The electronic circuit board is connected for extension to the motherboard through a connector mounted on the motherboard. Accordingly, the electronic circuit board is provided on one end portion thereof with an insert plate portion to be inserted into a receiving port of the connector. The signal electrode pads and ground electrode pads arranged on the surface of both sides of the insert plate portion at small pitches are pressure contacted with the signal contacts and the grounding contacts held in the receiving port for the connector, and the signal contact and the grounding contact are contacted with a signal line and a grounding line of the mother board.

In order to enhance an easy transmission of a high speed signal (high frequency signal) to a signal line by means of circuit designing, the electronic circuit board and the mother board (electronic circuit motherboard built in a computer) is designed such that the impedance of the signal line will be constant (in general, 50 Ω). For example, to provide a grounding line in the vicinity of the signal line is also one of the specific examples thereof.

However, in the connector for the electronic circuit board, since the signal contacts are arranged in array at small pitches, and they are pressure contacted with the signal electrode pads arranged in array at small pitches on the surface of one side of the electronic circuit board, a problem of stroke occurs between the signal contacts forming an input end or an output end of the signal line, or the impedance with respect to the high frequency signal of the signal contact cannot be brought into a correct value, and as a result, a problem of delay in transmission speed will occur when a high speed signal is transmitted.

In order to solve the above problems, the present inventors gave a thought to a process for bringing the grounding contact into contact with the grounding electrode pad between the signal contacts which are pressure contacted with the signal electrode pad by disposing the grounding electrode pads between the signal electrode pads. However, in such a construction, it is required to provide a new grounding electrode pad between the signal electrode pads which are arranged at small pitches, and therefore, presuming the arrangement pitches for the signal electrode pads are, for example, 1.0 mm each, the pitches between the signal electrode pad and the grounding electrode pad becomes 0.5 mm. As a result, manufacturing difficulty is encountered. In addition, it becomes increasingly difficult to correctly position the signal electrode pad and the grounding electrode pad, and the signal contact and the grounding contact so that they will be in correct corresponding relation to each other.

Moreover, according to the above process, since all the signal and grounding contacts are pressure contacted with all the signal and grounding electrode pads, respectively, the total number of cores to be subjected to pressure contact becomes about twice and the withdrawing force with respect to the connector of the electronic circuit board is overly increased.

The concept of the present invention came across the present inventors' mind based on the above finding.

SUMMARY OF THE INVENTION

It is, therefore, an object of the present invention to provide an electronic circuit board in a connector for said electronic circuit board which is capable of correctly coping with the above problems.

To achieve the above object, there is essentially provided an operation assuring structure of an electronic circuit board in a connector for the electronic circuit board including an insert plate portion disposed on an end portion of an electronic circuit board and adapted to be inserted into a receiving port of a connector, a plurality of signal electronic pads arranged on a surface of the insert plate portion, and a plurality of signal contacts disposed within the receiving port of the connector and adapted to be contacted to the signal electrode pads, wherein a cut-off grounding contact, which is not conductive to the electronic circuit board, is interposed between the signal contacts within the receiving port, and the cut-off grounding contact has a length dimension enough to extend in parallel to the signal contacts and to interpose a distal end thereof between the signal electrode pads on the insert plate portion.

The distal end of the cut-off grounding contact is preferably isolated with respect to a surface of the insert plate portion.

The cut-off signal contact is preferably the same in configuration as the signal contacts.

The above and other objects, characteristic features and advantages of the present invention will become more apparent to those skilled in the art by the following description of the preferred embodiment of the invention, as illustrated in the accompanying drawings.

BRIEF DESCRIPTION OF THE DRAWINGS

FIG. 6A shows a state in that the insert plate portion is not yet inserted, and FIG. 6B shows a state in that the insert plate portion is already inserted.

DETAILED DESCRIPTION OF THE EMBODIMENT

One embodiment of the present invention will now be described with reference to FIGS. 1 through 7.

Figure 7A:
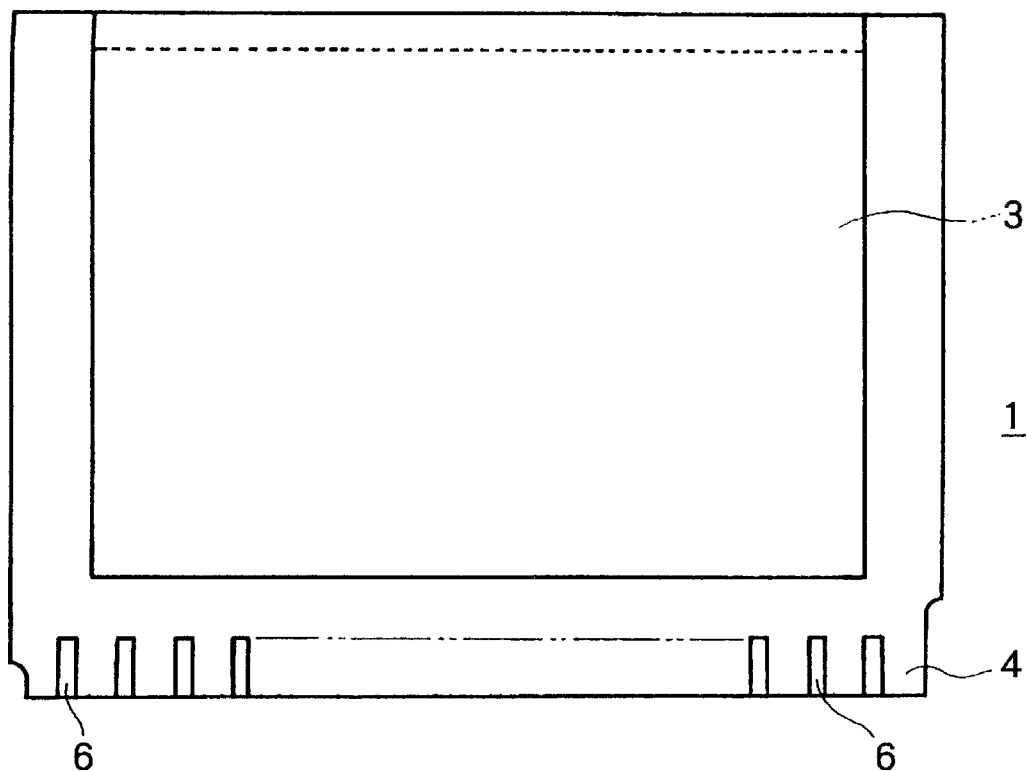
FIG. 7A is a plan view when the electronic circuit board is viewed from one surface thereof.
Figure 7B:
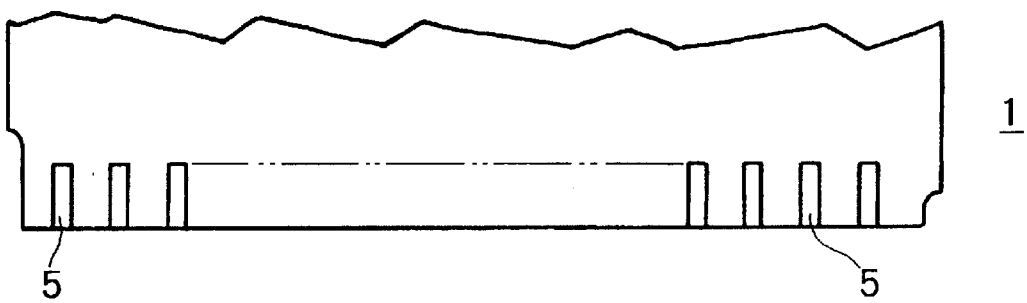
FIG. 7B is a plan view when the electronic circuit board is viewed from the other surface thereof.
Figure 7C:
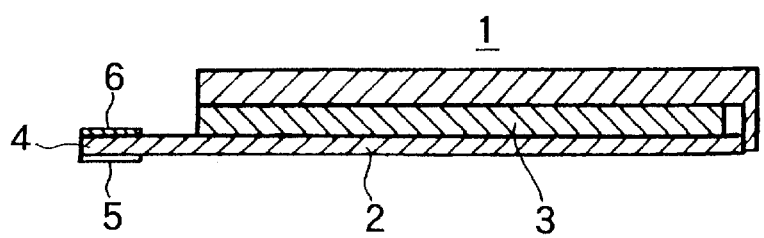
FIG. 7C is a side sectional view thereof.

As shown in FIGS. 7A–7C, an electronic circuit board 1 is of construction in which a memory device (IC chip) 3 is placed on one surface of a generally rectangular insulating substrate 2 in superimposed relation and integrally packaged. It has a generally rectangular insert plate portion 4 at one end of the insulating substrate 2, and therefore at one end of the electronic circuit board 1.

A large number of signal electrode pads 5 as external terminals of the memory device 3 are arranged in array at small pitches on one surface of the insert plate portion 4 along a marginal edge of the insert plate portion 4, while a required number of grounding electrode pads 6 serving as an external terminal of the memory device 3 are arranged in array on the other surface along a marginal edge of the insert plate portion 4. This construction of the electronic circuit board 1 is of a general construction of an extension circuit board.

Figure 1:
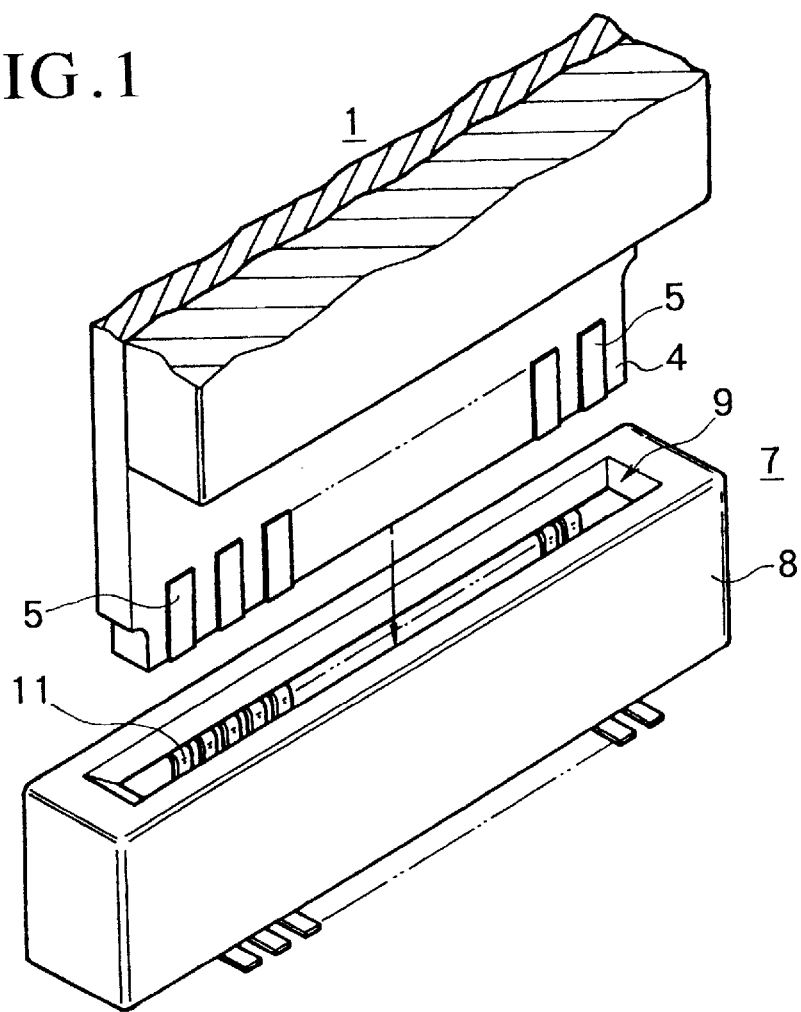
FIG. 1 is a perspective view of an insert plate portion and connectors of an electronic circuit board according to one embodiment of the present invention.
Figure 2:
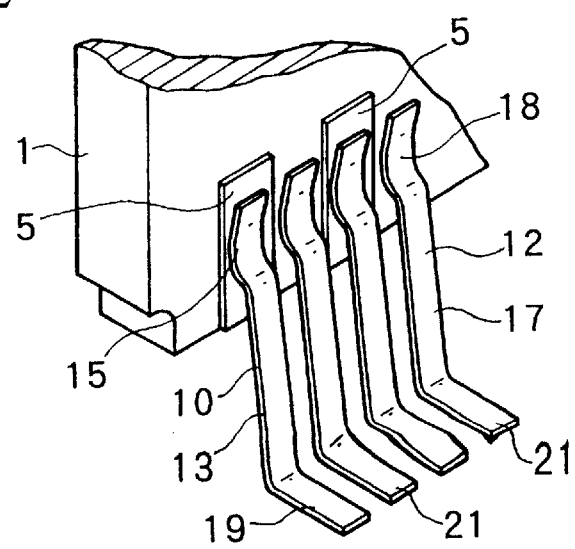
FIG. 2 is a perspective view of a main portion showing an arrangement states of the signal contacts and the cut-off signal contacts with respect to the insert plate portion.

On the other hand, a connector 7 to be surface mounted on the signal line and the grounding line of a motherboard, as shown in FIGS. 1 to 3, includes a generally rectangular parallelepiped connector body 8 made of insulating material, a receiving port 9 formed in the connector body 8 and adapted to receive the insert plate portion 4, signal contacts 10 to be pressure contacted with signal electrode pads 5 arranged on one surface of the insert plate portion 4, and grounding contacts 11 to be pressure contacted with grounding electrode pads 6 arranged on the other surface of the insert plate portion 4, the signal contacts 10 and the grounding contacts 11 being disposed within the receiving port 9.

Accordingly the signal contacts 10 and the grounding contacts 11 are of a single end abutment type spring structure. They are arranged in arrays in opposing relation along the receiving port 9. That is, the signal contacts 10 and the grounding contacts 11 are arranged in two arrays, one array for the signal contacts 10 and the other for the grounding contacts 11. Between the arrays of the signal and grounding contacts 10 and 11, an insert space for the insert plate portion 4 is formed.

A cut-off grounding contact 12 is interposed between the signal contacts 10. Accordingly, the signal contacts 10 and the cut-off grounding contacts 12 are held in the receiving port 9 such that they are alternately arranged in array. Basal end portions of the signal contacts 10, the grounding contact 11 and the cut-off grounding contacts 12 are implanted in an inner bottom wall of the receiving port 9 of the connector body 8, pierced through the bottom wall, then bent along the bottom surface of the connector body 8 and projected outwardly. Surface mounting terminal elements 19, 20, 21 are formed by such projected portions, which elements are to be surface mounted on the motherboard, that is, on the signal line or grounding line of the electronic circuit mother board. The signal contacts, 10, the grounding contacts 11 and the cut-off grounding contacts 12 extend from the implanted portions towards an opening portion of the receiving portion 9 and their distal ends are terminated in free ends, respectively.

Accordingly, each contact 10, 11, 12 can resiliently be displaced inwardly and outwardly about the implanted portion, and by such resiliency, they obtain pressure contact force with respect to each electrode pad 5,6.

Preferably, when the grounding contact 11 is inserted between the array of the signal contacts 10 and the cut-off grounding contact and the array of the grounding contact 11, the signal contact 10 and the grounding contact 11 are displaced outwardly against the resiliency by the insert plate portion 4, and the signal electrode pad 5 and the grounding electrode pad 6 are pressure contacted with each other by reaction thereof, and the cut-off grounding contact 12 is no-load with respect to the insert plate portion 3.

One preferred example in this respect will now be described in detail. As shown in FIGS. 2 and 3, as well as elsewhere, the signal contact 10 and the grounding contact 11 are blanked out so that they may have the same contact configuration of a single abutment type. Similarly, the cut-off grounding contact 12 is also blanked out into the same configuration as the contacts 10, 11, and interposed between the signal contacts 10.

The signal and grounding contacts 10, 11 include spring portions 13, 14 extending towards the opening portion 9 of the implanting portion, respectively. The signal and grounding contacts 10, 11 are provided on distal end portions (free end portions) thereof respectively with projections 15, 16 projecting in mutually confronting directions, that is, projections 15, 16 projecting towards the signal electrode pad 5 and the grounding electrode pad 6.

The cut-off grounding contact 12 has a length dimension enough to be interposed between the signal contacts 10, to extend in parallel relation to the signal contact 10, and to allow a distal end portion thereof to be interposed between the signal electrode pads 5 on the insert plate portion 4.

Specifically, the cut-off grounding contact 12 includes a spring portion 17 extending in parallel to the spring portion 13 of the signal contact 10. It has on its distal end portion a projection 18, like that of the signal contact 10, projecting inwardly, that is, projection 18 projecting towards the surface of the insert plate portion 4.

This projection 18, that is, the distal end portion (free end portion) of the cut-off grounding contact 12 is interposed between the signal electrode pads 5, that is, interposed between the projections 15 of the signal contacts 10, so that it will become electrically non-conductive with respect to the insert plate portion 4 of the electronic circuit board 1. Preferably, the distal end (projection 18) of the cut-off grounding contact 12 is slightly spaced apart from the surface of the insert plate portion 4 so as to be in an isolated state.

As discussed above, one end of the cut-off grounding contact is in non-conductive and non-contacting state with respect to the extension electronic circuit board 1, and the other end is contacted to the grounding line of the motherboard.

When the insert plate portion 4 of the electronic circuit board 1 is inserted between the array of the signal contacts 10 and the cut-off grounding contacts and the array of the grounding contacts 11 through the receiving port 9, only the signal and grounding 10, 11 are resiliently displaced outwardly by insertion of the insert plate portion 4 and pressure contacted with the signal and grounding electrode pads 5,6 by reaction thereof, and the cut-off grounding contact 12 is interposed between the signal contacts 10 in non-conductive state and with no load and interposed between the signal electrode pads 5.

The cut-off grounding contact 12 is formed into a same configuration as the signal and grounding contacts 10, 11. If limited only to the cut-off purpose, it may be in other form for cutting off the relation between the signal contacts 10, for example, it may be a planar contact having a broader area than the confronting sectional area of the adjacent signal contact 10.

Figures 3A, 3B:
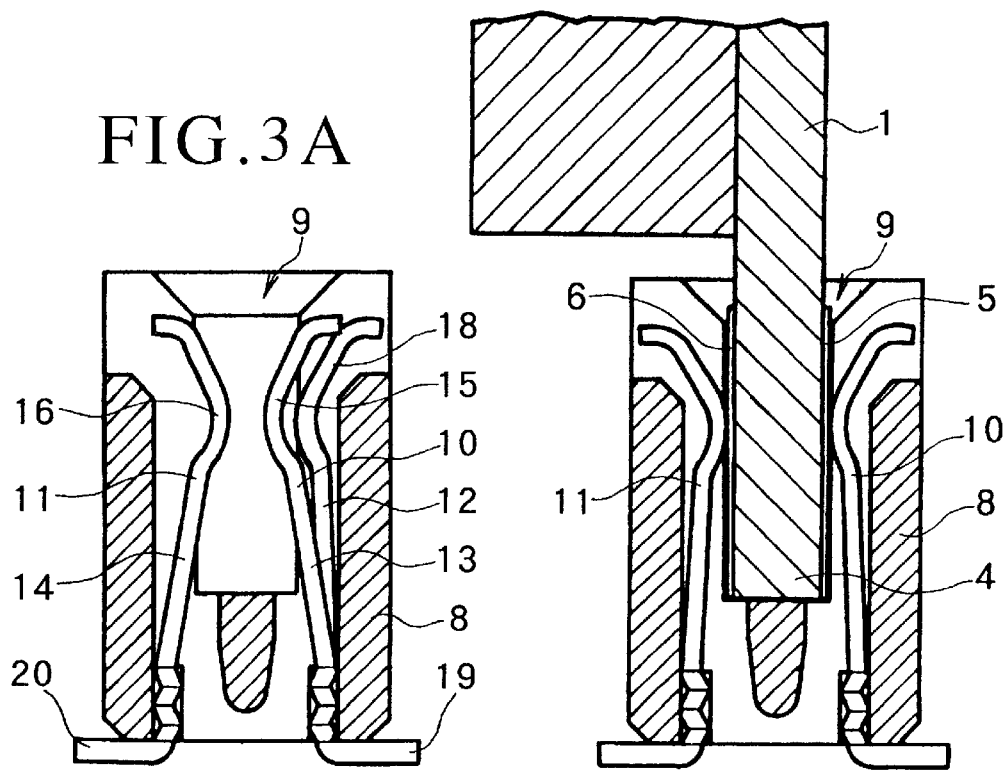
FIG. 3A is a sectional view of the connector.
FIG. 3B is a sectional view showing an inserted state of the insert plate portion of the electronic circuit board into this connector.
Figure 4:
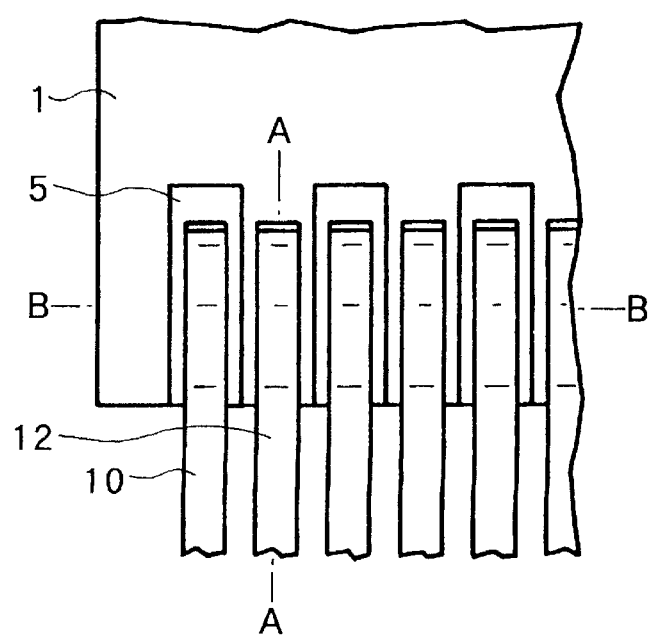
FIG. 4 is a front view of FIG. 2.
Figure 5:
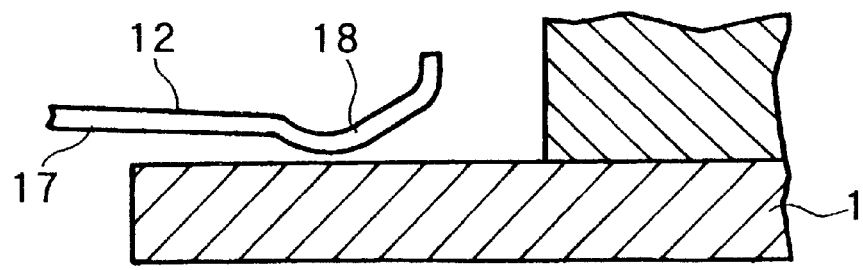
FIG. 5 is a sectional view taken on line A—A of FIG. 4 showing an installation state of the cut-off grounding contacts with respect to the insert plate portion.
Figure 6A:
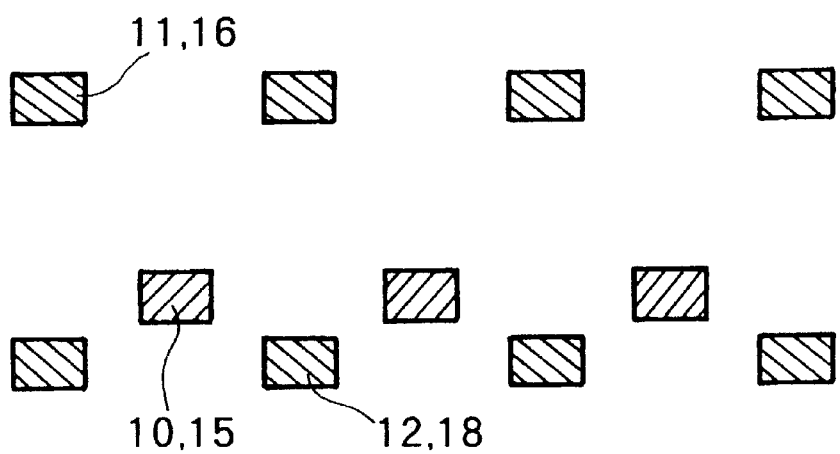
FIGS. 6A and 6B are sectional views taken on line B—B of FIG. 4.
Figure 6B:
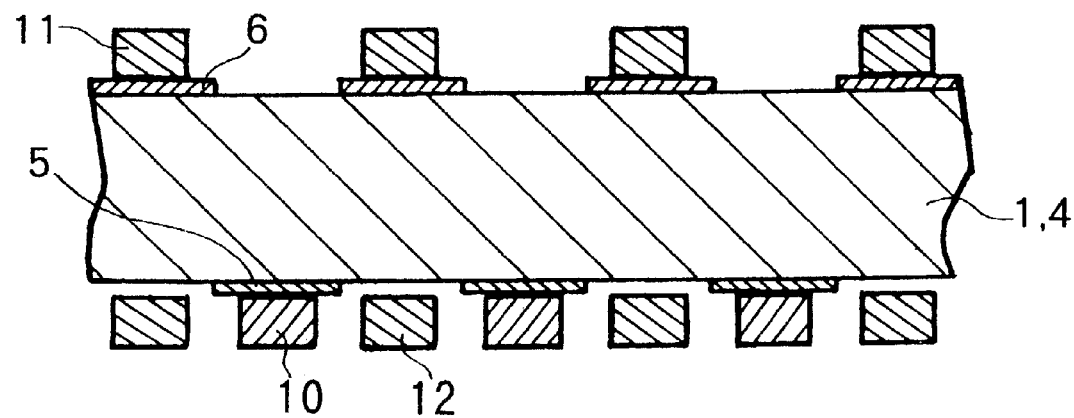

As shown in FIG. 3A and 6A, the cut-off grounding contact 12 is located in position offset backwardly of the signal contact 10 when the insert plate portion 4 of the electronic circuit board 1 is not inserted into the receiving port 9 (normal state), while, as shown in FIGS. 3B and 6B, the signal contact 10 is resiliently displaced backwardly and brought into the generally same phase as the cut-off grounding contact 12, that is, the adjacent surfaces of the projections 15, 18 and the spring portion 13, 17 are in generally opposing relation when the insert plate portion 4 is inserted. At that time, the projection 18 of the cut-off grounding contact 12 is isolated from the surface of the insert plate portion 4, and held in a non-conductive and non-contacting state.

The present invention is also applicable to a case where the signal electrode pads 5 and the grounding electrode pads 6 are partly arranged on one surface of the insert plate portion and the contacts 10, 11 are arranged in such a manner as to correspond thereto.

According to the present invention, the problem of crosstalk and mismatching of impedance, which is brought up when the electronic circuit board is connected to the motherboard through a connector in order to achieve extension of memory, can be solved adequately, and this object can effectively be achieved by extremely simple means in which the cut-off grounding contact is interposed between the signal contacts. In addition, by making the cut-off grounding contact non-conductive and no-load with respect to the electronic circuit board, the present invention exhibits such advantages that increase of insertion and withdrawal resistance of the circuit board does not occur and extension of the electrode pads is not required.

Although this invention has been described in its preferred form with a certain degree of particularity, it is understood that the present disclosure of the preferred form has been made only by way of example and that numerous changes in the details of construction and arrangement of parts may be resorted to without departing from the spirit and the scope of the invention as hereinafter claimed.

What is claimed is:

1. An operation assuring structure of an electronic circuit board in a connector including an insert plate portion disposed on an end portion of the electronic circuit board and adapted to be inserted into a receiving port of the connector, a plurality of signal electronic pads arranged on a surface of said insert plate portion, and a plurality of signal contacts disposed within said receiving port of said connector and adapted to be contacted to said signal electrode pads, wherein a cut-off grounding contact, which is not electrically connected to said electronic circuit board, is interposed between said signal contacts within said receiving port, and said cut-off grounding contact has a length dimension enough to extend in parallel to said signal contacts and to interpose a distal end thereof between said signal electrode pads on said insert plate portion.

2. The operation assuring structure of an electronic circuit board in a connector for said electronic circuit board according to claim 1, wherein the distal end of said cut-off grounding contact is isolated with respect to a surface of said insert plate portion.

3. The operation assuring structure of an electronic circuit board in a connector for said electronic circuit board according to claim 1, wherein said cut-off signal contact is identical in configuration as said signal contacts.

* * * * *